(12) United States Patent
Hsu et al.

(10) Patent No.: US 10,937,950 B2
(45) Date of Patent: Mar. 2, 2021

(54) SEMICONDUCTOR STRUCTURE

(71) Applicant: TAIWAN SEMICONDUCTOR MANUFACTURING COMPANY LTD., Hsinchu (TW)

(72) Inventors: Chern-Yow Hsu, Hsin-Chu County (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/833,090

(22) Filed: Mar. 27, 2020

(65) Prior Publication Data
US 2020/0227629 A1    Jul. 16, 2020

Related U.S. Application Data

(62) Division of application No. 16/110,850, filed on Aug. 23, 2018, now Pat. No. 10,658,571.

(60) Provisional application No. 62/587,898, filed on Nov. 17, 2017.

(51) Int. Cl.
| | |
|---|---|
| *H01L 43/08* | (2006.01) |
| *H01L 27/22* | (2006.01) |
| *H01L 43/02* | (2006.01) |
| *G11C 11/16* | (2006.01) |
| *H01L 43/12* | (2006.01) |

(52) U.S. Cl.
CPC ............ *H01L 43/08* (2013.01); *H01L 27/226* (2013.01); *H01L 43/02* (2013.01); *H01L 43/12* (2013.01); *G11C 11/161* (2013.01)

(58) Field of Classification Search
CPC ......... H01L 43/08; H01L 43/02; H01L 43/12; H01L 27/226; H01L 27/222; G11C 11/161; G11C 14/0036; G11C 14/0081
See application file for complete search history.

(56) References Cited

U.S. PATENT DOCUMENTS

| | | | |
|---|---|---|---|
| 2008/0206895 A1* | 8/2008 | Asao | H01L 43/12 438/3 |
| 2014/0203236 A1* | 7/2014 | Chen | H01L 45/16 257/4 |
| 2015/0069480 A1* | 3/2015 | Kanaya | G11C 11/16 257/295 |
| 2016/0276580 A1* | 9/2016 | Tahmasebi | H01L 43/12 |
| 2017/0084820 A1* | 3/2017 | Tan | H01L 43/08 |
| 2017/0170386 A1* | 6/2017 | Chuang | H01L 43/02 |
| 2017/0194344 A1* | 7/2017 | Wu | H01L 29/40117 |

* cited by examiner

*Primary Examiner* — Galina G Yushina
(74) *Attorney, Agent, or Firm* — WPAT, P.C., Intellectual Property Attorneys; Anthony King

(57) ABSTRACT

The present disclosure provides a semiconductor structure including a first electrode via, a first electrode on the first electrode via, a magnetic tunneling junction (MTJ) over the first electrode, a second electrode over the MTJ, a first dielectric layer on a top surface of the first electrode via, a second dielectric layer over the first electrode, the MTJ, the second electrode, and the first dielectric layer. A sidewall of the MTJ is in contact with the second dielectric layer.

20 Claims, 12 Drawing Sheets

SEMICONDUCTOR STRUCTURE

CROSS REFERENCE TO RELATED APPLICATION

This application claims the benefit of prior-filed provisional application No. 62/587,898, filed Nov. 17, 2017 and prior-filed application Ser. No. 16/110,850, filed Aug. 23, 2018, under 35 U.S.C. 120.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device. MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
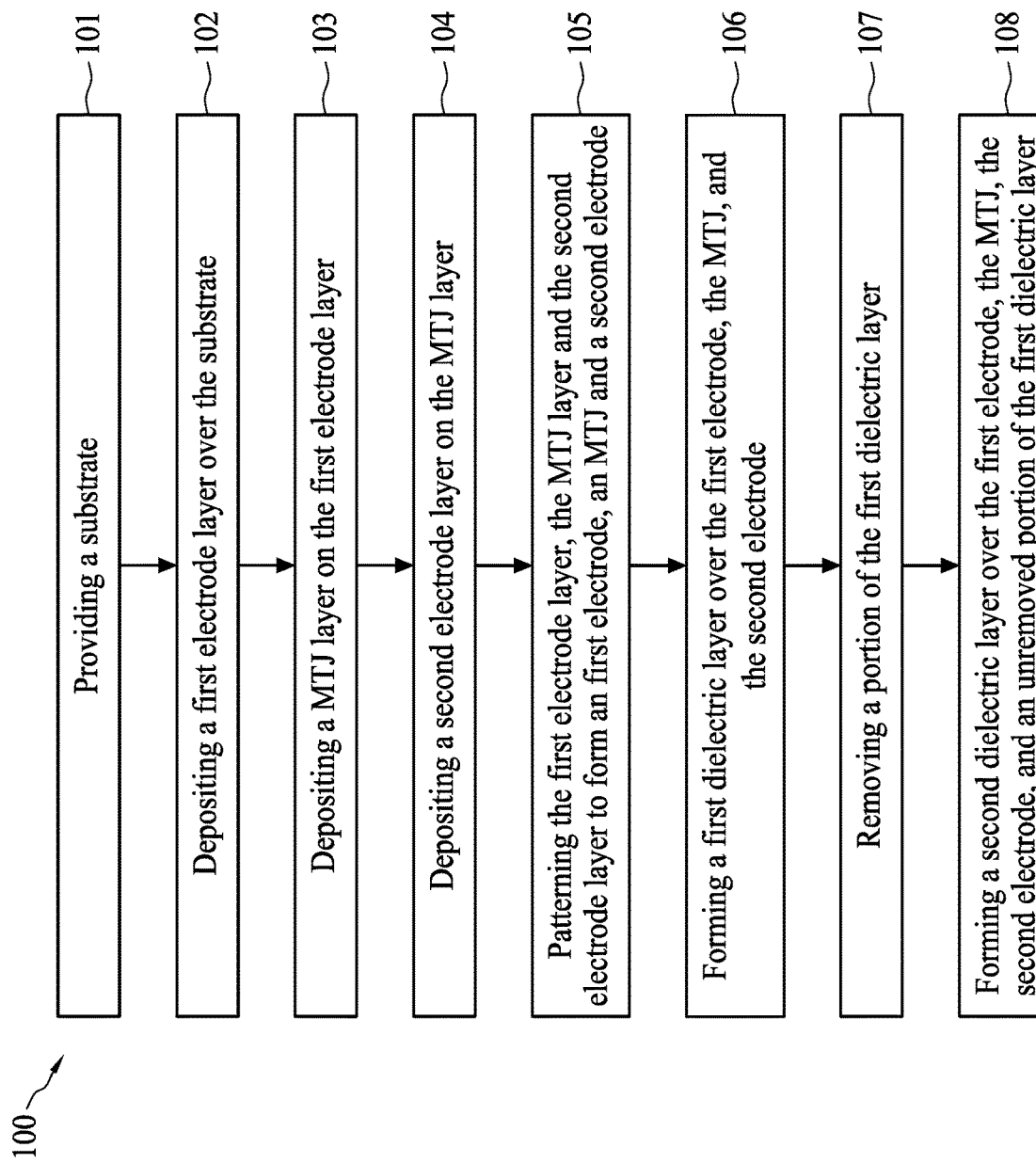
FIG. 1 is a flowchart illustrating a method of manufacturing a semiconductor structure according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded magnetoresistive random access memory (MRAM) cell in a complementary metal-oxide-semiconductor (CMOS) structure has been continuously developed. A semiconductor memory device with embedded MRAM cells includes an MRAM cell region and a logic region. The MRAM cell region may comprise a plurality of MRAM cells. The logic region may comprise a plurality of conductive lines or metal lines. The plurality of conductive lines may provide routing for the plurality of MRAM cells. The logic region and the MRAM cell region may be disposed in different regions in the semiconductor memory device. For example, the MRAM cell region may be located at the center of the semiconductor memory device while the logic region may be located at a periphery of the semiconductor memory device. However, such an example is not intended to be limiting. Other arrangements of the MRAM cell region and the logic region fall within the contemplated scope of the present disclosure.

In the MRAM cell region, a transistor structure may be disposed under an MRAM structure. In some embodiments, an MRAM cell is embedded in a metallization layer prepared in a back-end-of-line (BEOL) operation. In some embodiments, transistor structures in the MRAM cell region and the logic region are disposed in a same semiconductor substrate and prepared in a front-end-of-line (FEOL) operation, and thus are substantially identical. The MRAM cell can be embedded in any position of the metallization layer, for example, between adjacent metal line layers extending in parallel over the semiconductor substrate. In some embodiments, the embedded MRAM cell can be located between a $4^{th}$ metal line layer and a $5^{th}$ metal line layer in the MRAM cell region. In the logic region, the $4^{th}$ metal line layer is connected to the $5^{th}$ metal line layer though a $4^{th}$ metal via, which is located between the $4^{th}$ metal line layer and the $5^{th}$ metal line layer. In other words, taking the MRAM cell region and the logic region into consideration, an embedded MRAM cell has a thickness of at least a portion of the $5^{th}$ metal line layer and the $4^{th}$ metal via. The architecture of the metal line layers herein is exemplary and not limiting. In general, people having ordinary skill in the art can understand that the MRAM cell is located between an $N^{th}$ metal line layer and an $(N+1)^{th}$ metal line layer, where N is an integer greater than or equal to 1.

The embedded MRAM cell includes a magnetoresitive cell. In some embodiments, the magnetoresitive cell is a magnetic tunneling junction (MTJ) composed of ferromagnetic materials. The MTJ may comprise a ferromagnetic free layer, a tunnel layer, and a ferromagnetic fixed layer. The ferromagnetic free layer and the ferromagnetic fixed layer are electrically coupled to the MTJ for signal/bias conveyance. Following the example previously provided, the ferromagnetic free layer is further connected to the $N^{th}$ metal line layer, whereas the ferromagnetic fixed layer is further connected to the $(N+1)^{th}$ metal line layer.

The magnetization direction of the ferromagnetic free layer can be reversed by applying a current through the tunnel layer, which causes injected polarized electrons within the ferromagnetic free layer to exert spin torques on the magnetization of the ferromagnetic free layer. The ferromagnetic fixed layer has a fixed magnetization direction. When current flows in the direction from the ferromagnetic free layer to the ferromagnetic fixed layer, electrons flow in a reverse direction, that is, from the ferromagnetic fixed layer to the ferromagnetic free layer. The electrons are polarized to the same magnetization direction of the ferromagnetic fixed layer after passing the ferromagnetic fixed layer, flow through the tunnel layer and then into and accumulate in the ferromagnetic free layer. Eventually, the magnetization of the ferromagnetic free layer is parallel to that of the ferromagnetic fixed layer, and the MTJ device will be at a low resistance state. Such electron injection caused by current is referred to as a major injection.

When current flowing from the ferromagnetic fixed layer to the ferromagnetic free layer is applied, electrons flow in the direction from the ferromagnetic free layer to the ferromagnetic fixed layer. Electrons having the same polarization as the magnetization direction of the ferromagnetic fixed layer are able to flow through the tunnel layer and into the ferromagnetic fixed layer. Conversely, electrons with polarization different from the magnetization of the ferromagnetic fixed layer are reflected (blocked) by the ferromagnetic fixed layer and accumulate in the ferromagnetic free layer. Eventually, the magnetization of the ferromagnetic free layer becomes anti-parallel to that of the ferromagnetic fixed layer, and the MTJ device will be at a high resistance state. Such electron injection caused by current is referred to as a minor injection.

In a series of manufacturing operations, an ion beam etching (IBE) may be incorporated for the sidewall damage reduction and removal when patterning the MTJ structure. Compared to plasma etching, IBE provides more physical bombardment than chemical-assisted removal and thus preventing sidewall of the as-patterned MTJ structure from chemical damages. Alternatively, IBE can be exploited after plasma etching for sidewall chemical damage removal. The application of IBE in MTJ patterning effectively improves the tunneling magnetoresistance and the coercivity of the memory device.

However, during IBE treatment, the ion beam may cause a bottom electrode of the MTJ structure to re-sputter elements to the sidewall of the MTJ structure. Consequently, this may short the MTJ structure and deteriorate performance of the memory device.

Referring to FIG. 1, FIG. 1 is a flowchart illustrating a method 100 of manufacturing a semiconductor structure according to some embodiments of the present disclosure. In some embodiments, the method 100 includes operations 101-108. In operation 101, a substrate is provided. In operation 102, a first electrode layer of a MTJ structure is deposited over the substrate. In operation 103, an MTJ layer is deposited on the first electrode layer. In operation 104, a second electrode layer is deposited over the MTJ layer. In operation 105, the first electrode layer, the MTJ layer, and the second electrode layer are patterned to form a first electrode, an MTJ, and a second electrode. In operation 106, a first dielectric layer is formed over the first electrode, the MTJ, and the second electrode. In operation 107, a portion of the first dielectric layer is removed. In operation 108, a second dielectric layer is formed over the first electrode, the MTJ, the second electrode, and an unremoved portion of the first dielectric layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
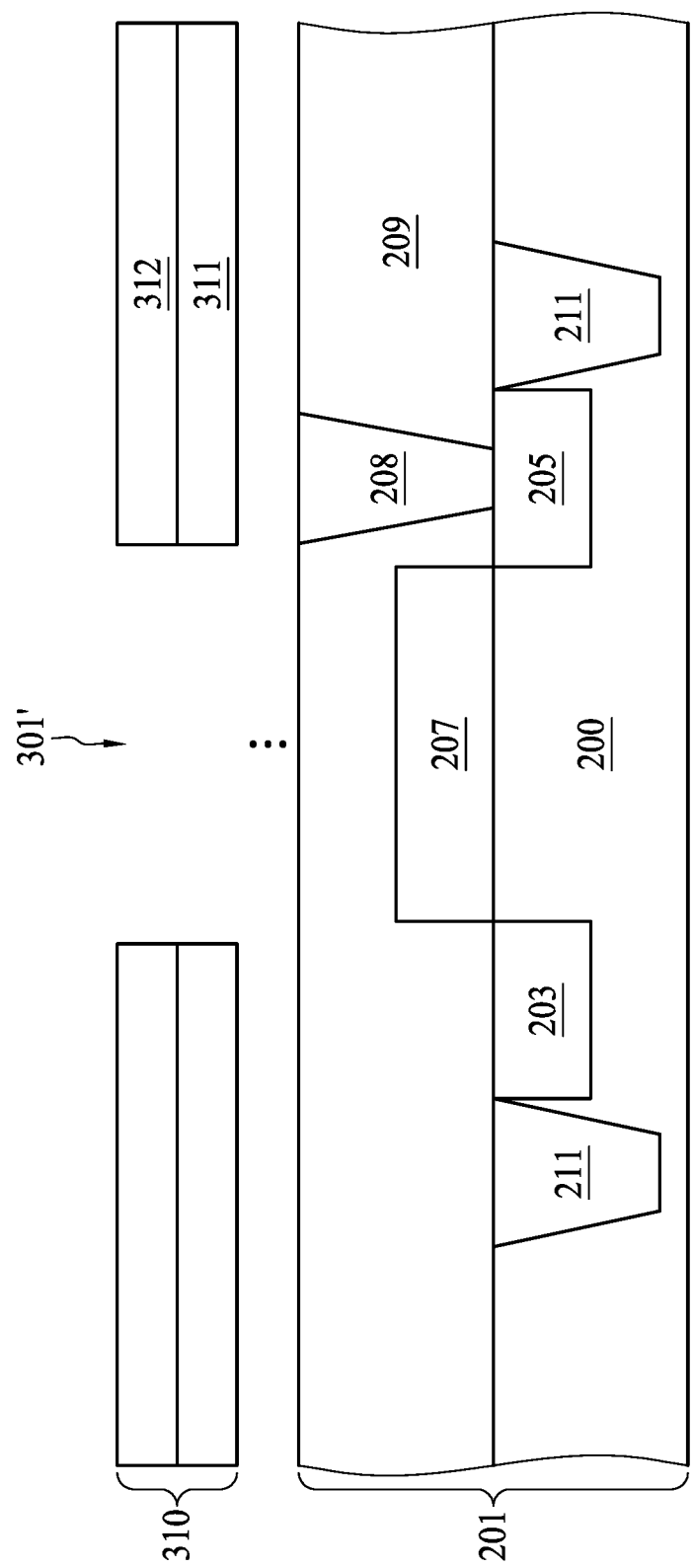
FIG. 2 to FIG. 12 are cross sections of a semiconductor structure fabricated at various stages, in accordance with some embodiments of the present disclosure.

FIG. 2 to FIG. 12 are cross sections of a semiconductor structure fabricated at various stages, in accordance with some embodiments of the present disclosure. Referring to FIG. 2 and operation 101 in FIG. 1, the substrate 200 is provided. In some embodiments, the substrate 200 is a semiconductor substrate. In some embodiments, the substrate 200 may be but is not limited to, for example, a silicon substrate. In some embodiment, substrate 200 is a semiconductor substrate, such as a silicon substrate, although it may include other semiconductor materials, such as silicon germanium, silicon carbide, gallium arsenide, or the like. In some embodiments, the substrate 200 is a p-type semiconductor substrate (P-Substrate) or an n-type semiconductor substrate (N-Substrate) comprising silicon. Alternatively, the substrate 200 includes another elementary semiconductor, such as germanium, a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 200 is a semiconductor on insulator (SOI). In other alternatives, substrate 200 may include a doped epi layer, a gradient semiconductor layer, and/or a semiconductor layer overlying another semiconductor layer of a different type, such as a silicon layer on a silicon germanium layer. The substrate 200 may or may not include doped regions, such as a p-well, an n-well, or combination thereof.

In some embodiments, the substrate 200 has a transistor structure 201. The substrate 200 further includes heavily doped regions such as sources 203 and drains 205 at least partially in the substrate 200. A gate 207 is positioned over a top surface of the substrate 200 and between the source 203 and the drain 205. Contact plugs 208 are formed in inter-layer dielectric (ILD) 209, and may be electrically coupled to the transistor structure 201. In some embodiments, the ILD 209 is formed on the substrate 200. The ILD 209 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 209 above the substrate 200 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 2 shows a planar transistor having a doped region in the substrate 200. However, the present disclosure is not limited thereto. Any non-planar transistor, such as a FinFET structure, can have raised doped regions.

In some embodiments, a shallow trench isolation (STI) 211 is provided to define and electrically isolate adjacent transistors. A number of STIs 211 are formed in the substrate 200. The STI 211, which may be formed of suitable dielectric materials, may be provided to isolate a transistor electrically from neighboring semiconductor devices such as other transistors. The STI 211 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

In some embodiments, because MRAM cell can be embedded in any position of the metallization layer, the omission of a portion of the metallization structure is represented by dots. In some embodiments, the metallization layer comprises the metal lines and metal vias.

In some embodiments, a barrier layer 310 in a form of a stacking layer including a SiC layer 311 and a tetraethyl orthosilicate (TEOS) layer 312 are blanket deposited over substrate 200. In some embodiments, a first electrode via hole 301' is opened in the barrier layer 310. Alternatively, the TEOS 312 can be replaced or combined with silicon-rich oxides (SRO).

In some embodiments, the barrier layer 310 may be formed by a variety of techniques, e.g., chemical vapor deposition (CVD), low-pressure CVD (LPCVD), plasma-enhanced CVD (PECVD), sputtering and physical vapor deposition (PVD), thermal growing, and the like. In some embodiments, a photoresist layer (not shown) is patterned over the stacking barrier layer 310 to expose a first electrode region of the MTJ structure. In some embodiments, the first electrode via hole 301' may be formed in the barrier layer 310 by a suitable dry etch operation.

Figure 3:
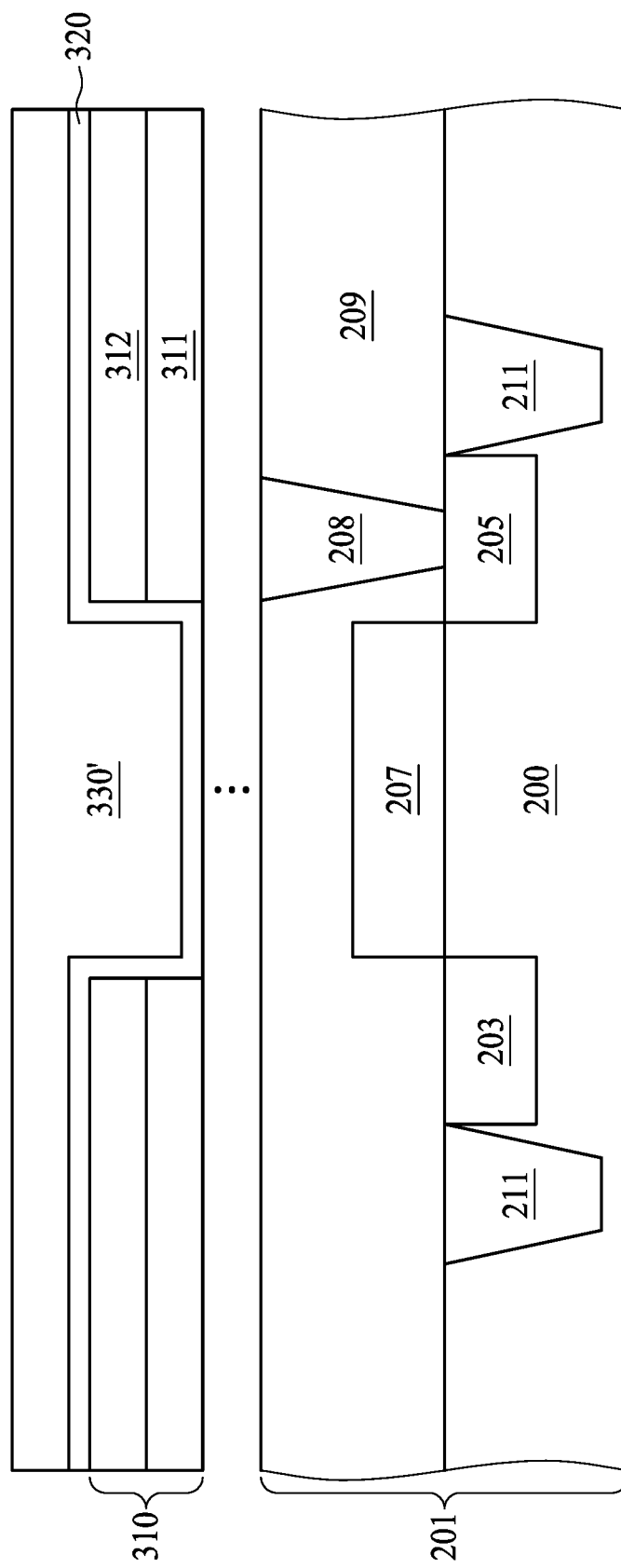

Referring to FIG. 3 and operation 102 in FIG. 1, a via or a bottom electrode via 330' and a diffusion layer 320 are deposited over the substrate 200. In some embodiments, the via or the bottom electrode via 330' functions as a portion of the bottom electrode in the MRAM structure. In some embodiments, the diffusion barrier layer 320 is conformably deposited prior to the filling of the bottom electrode via 330'. In some embodiments, the bottom electrode via 330' is formed over the diffusion barrier layer 320.

Figure 4:
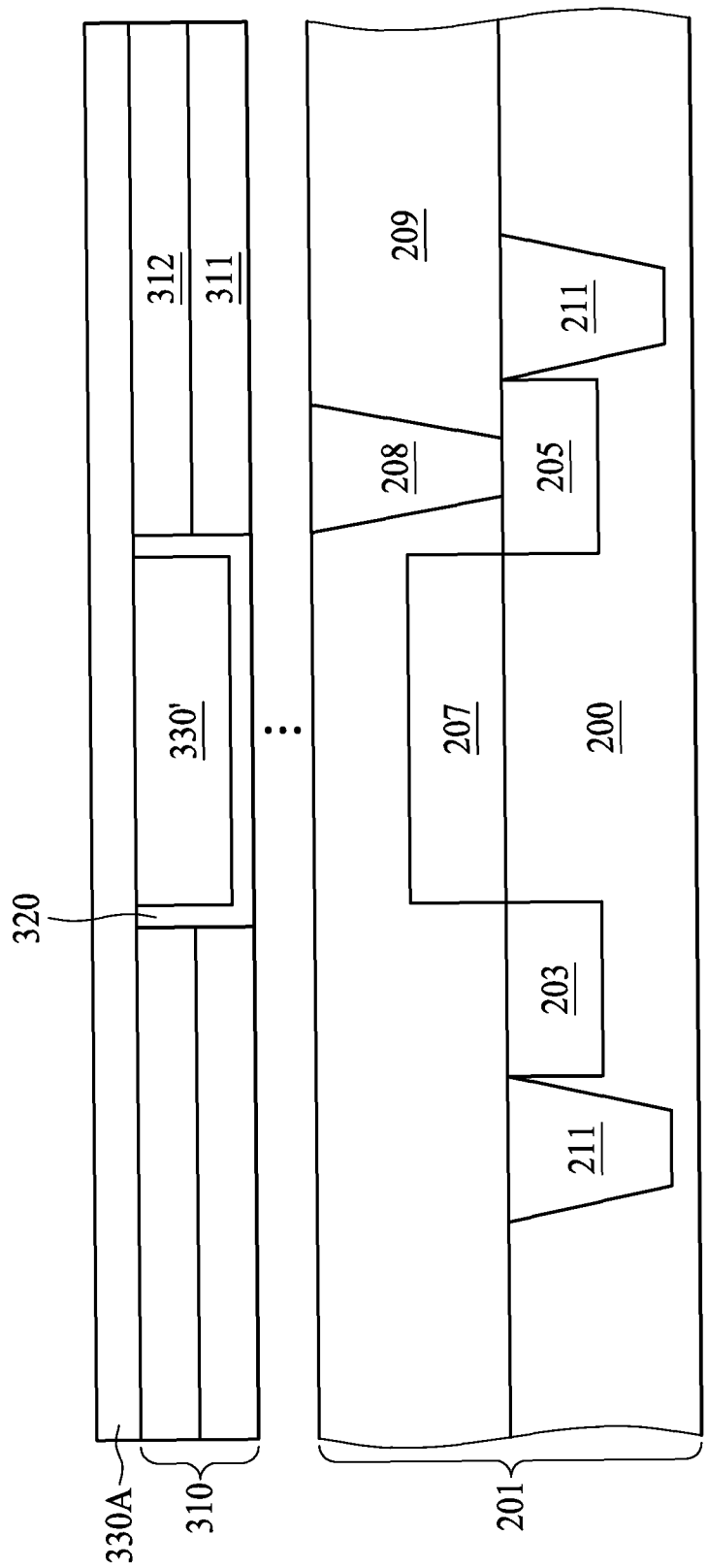

Referring to FIG. 4, in some embodiments, the bottom electrode via 330' and the diffusion barrier layer 320 are etched back to level with a top surface of the barrier layer 310. In some embodiments, the first electrode layer 330A is then formed and thinned to a predetermined thickness. In some embodiments, the first electrode layer 330A may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the first electrode layer 330A may be composed of metal nitride such as TaN, TiN, or the combinations thereof.

Figure 5:
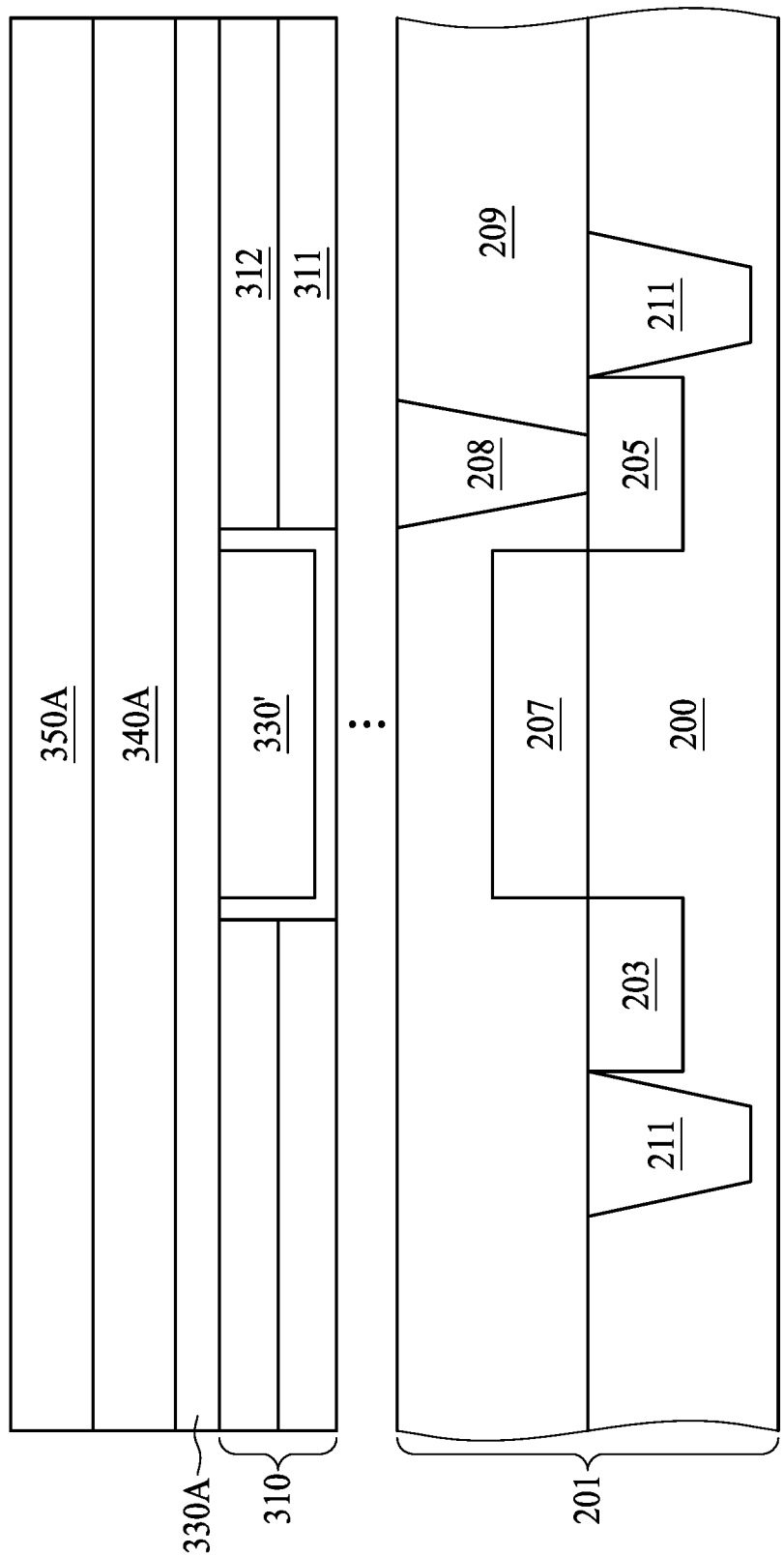

Referring to FIG. 5 and operation 103 in FIG. 1, the MTJ layer 340A is deposited on the first electrode layer 330A. In some embodiments, the MTJ layer 340A is deposited over the first electrode layer 330A of the first electrode layer 330A. In some embodiments, the MTJ layer 340A is deposited in a form of multiple material stacked over the first electrode layer 330A. The MTJ layer 340A may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In some embodiments, the MTJ layer 340A may include the ferromagnetic layers, the spacers, and the capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ layer 340A may include an antiferromagnetic layer in accordance with other embodiments.

Referring to FIG. 5 and operation 104 in FIG. 1, the second electrode layer 350A is deposited over the MTJ layer 340A. The second electrode layer 350A may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the second electrode layer 350A may include metal nitrides. Materials constituting the first electrode layer 330A and the second electrode layer 350A may or may not be identical.

Figure 6:
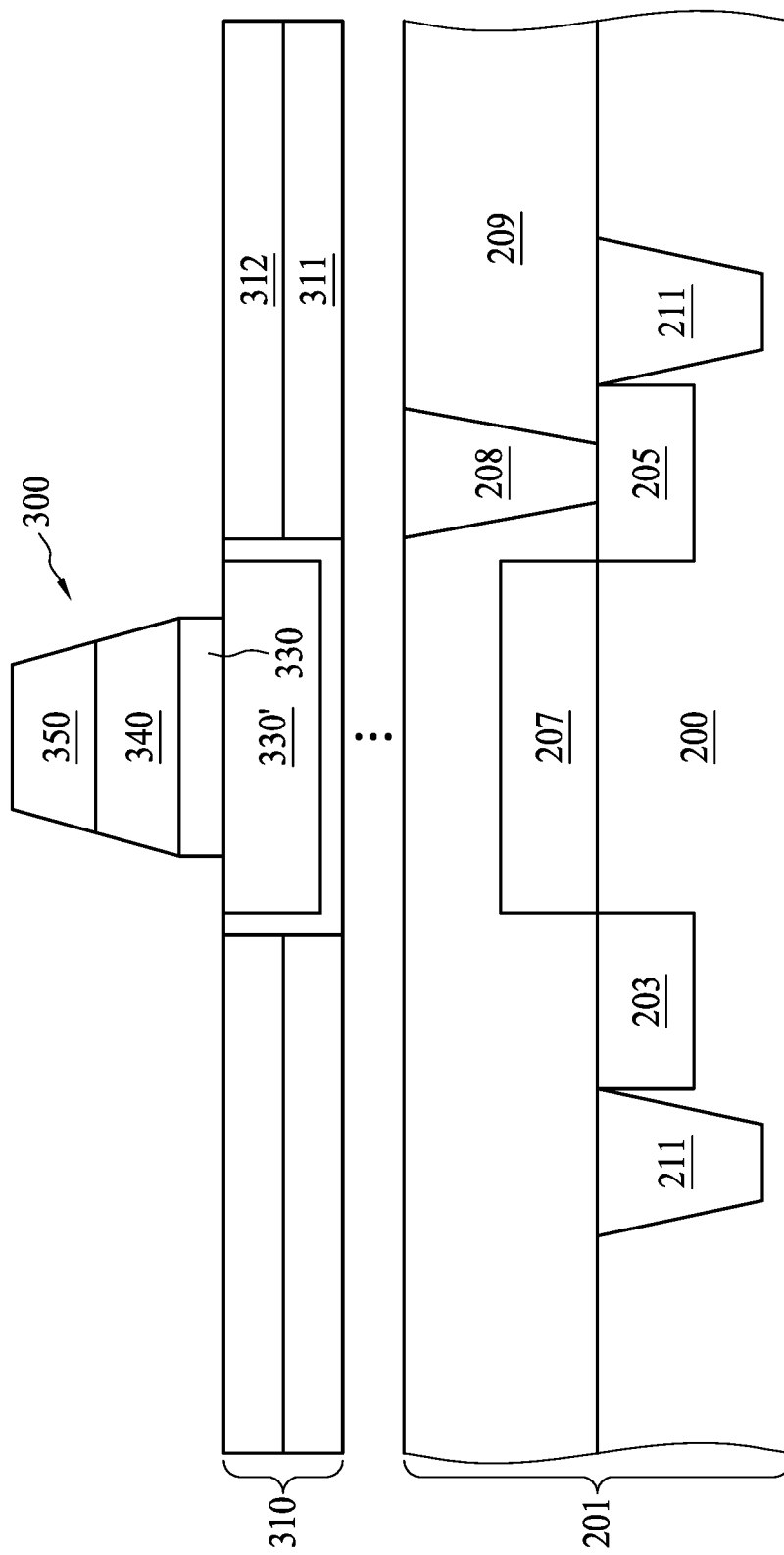

Referring to FIG. 6 and operation 105 in FIG. 1, the MTJ layer, the second electrode layer, and the first electrode layer are patterned in a lithography operation to form a first electrode 330, an MTJ 340, and a second electrode 350 of the MTJ structure 300. In some embodiments, the MTJ structure 300 at least includes a bottom electrode, a top electrode, and an MTJ. In some embodiments, the first electrode 330 and the bottom electrode via 330' may collectively function as the bottom electrode of the MTJ structure 300. In some embodiments, the second electrode 350 may function as the top electrode of the MTJ structure 300. In some embodiments, the first electrode 330, the MTJ 340, and the second electrode 350 are patterned in a single operation.

In some embodiments, a mask layer (not shown) exposing a desired MTJ pattern is formed over the second electrode layer 350A (as shown in FIG. 5) for the ensuing MTJ structure formation. The mask layer possessing the desired MTJ pattern and may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ 340 and the second electrode 350. For example, a width of the masking region is determined according to the desired MTJ diameter. In some embodiments, the MTJ 340 and the second electrode 350 may be formed by an RIE to have a trapezoidal shape viewing from a cross section.

In some embodiments, the first electrode 330 is electrically coupled with the doped region. In some embodiments, the doped region is the drain 205 or the source 203. In other embodiments, the first electrode 330 is electrically coupled with the gate 207. In some embodiments, the gate 207 may be a polysilicon gate or a metal gate.

Figure 7:
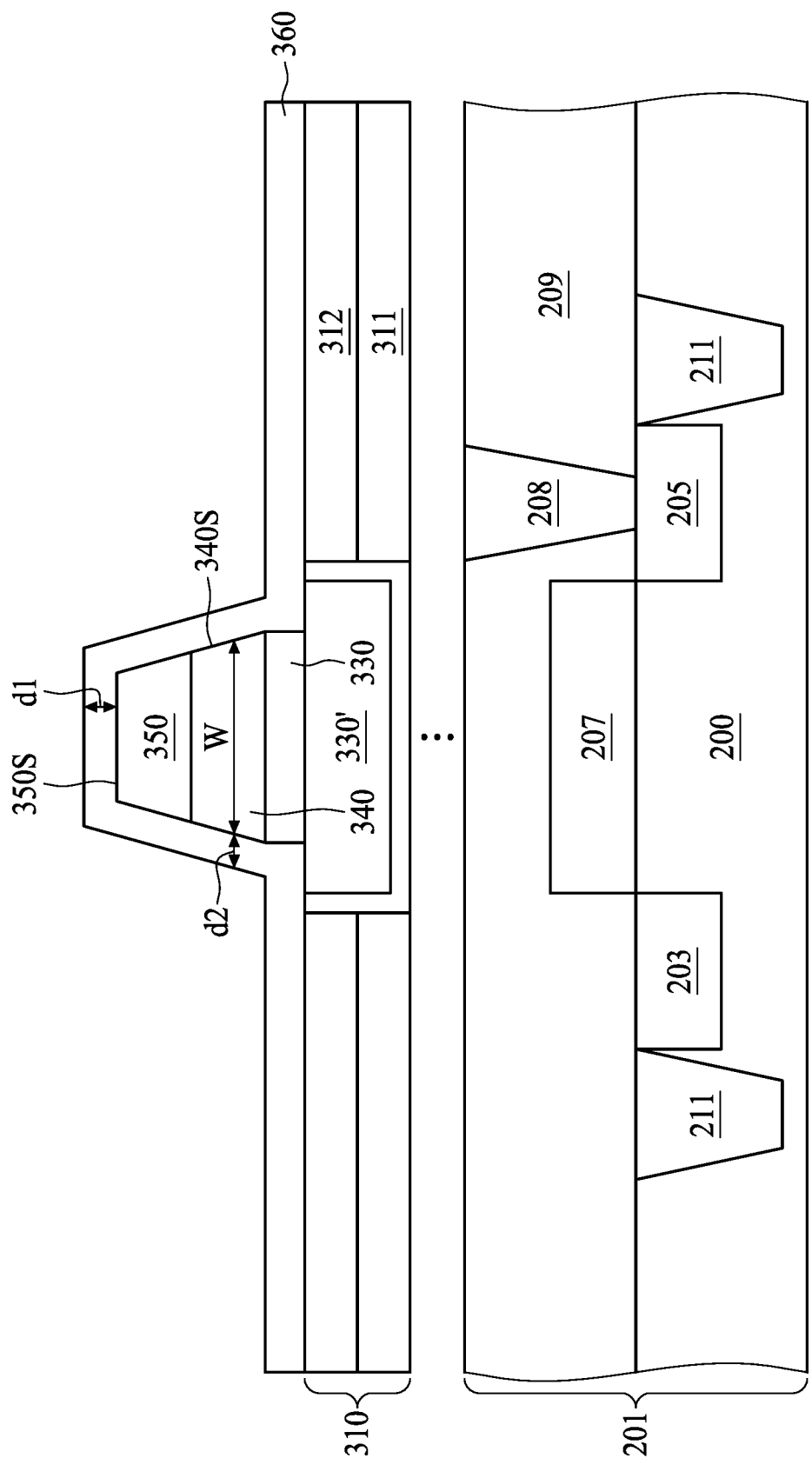

Referring to FIG. 7 and operation 106 in FIG. 1, the first dielectric layer 360 is formed over the first electrode 330, the MTJ 340, the second electrode 350, and the barrier layer 310. In some embodiments, the first dielectric layer 360 has an overall thickness of from about 1 nm to about 12 nm. In some embodiments, the thickness d2 of the as-deposited first dielectric layer 360 on the sidewall 340S of the MTJ 340 is thinner than the as-deposited thickness d1 on the top surface 350S of and the second electrode 350. In some embodiments, the as-deposited thickness d1 may be from about 3 nm to about 12 nm. In some embodiments, the ratio (d1/d2) between the thickness d1 and the thickness d2 may be from about 1.2 to about 3. In some embodiments, a ratio (d2/W) of the thickness d2 to the critical dimension W of the MTJ 340 may be in a range from about 1% to about 12%. In some embodiments, the critical dimension W is measured as a width of the tunneling barrier layer of the MTJ 340.

In some embodiments, the first dielectric layer 360 includes materials of silicon oxide ($SiO_x$), silicon nitride ($SiN_x$), silicon oxynitride (SiON), or silicon carbide (SiC), which may be formed by plasma deposition operation, such as Atomic layer deposition (ALD), physical vapor deposition (PVD), or chemical vapor deposition (CVD) including plasma enhanced chemical vapor deposition (PECVD).

Figure 8:
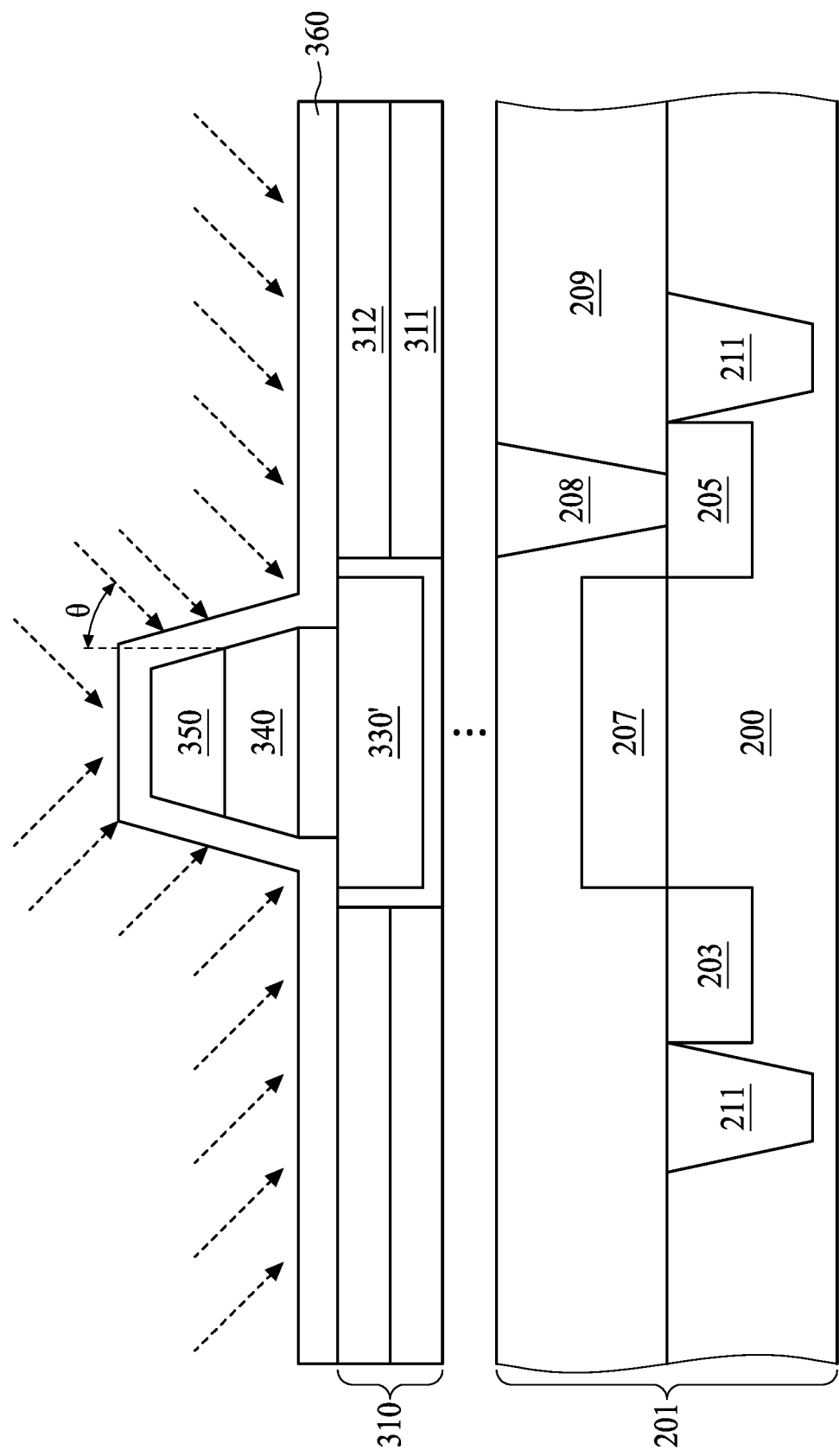
Figure 9:
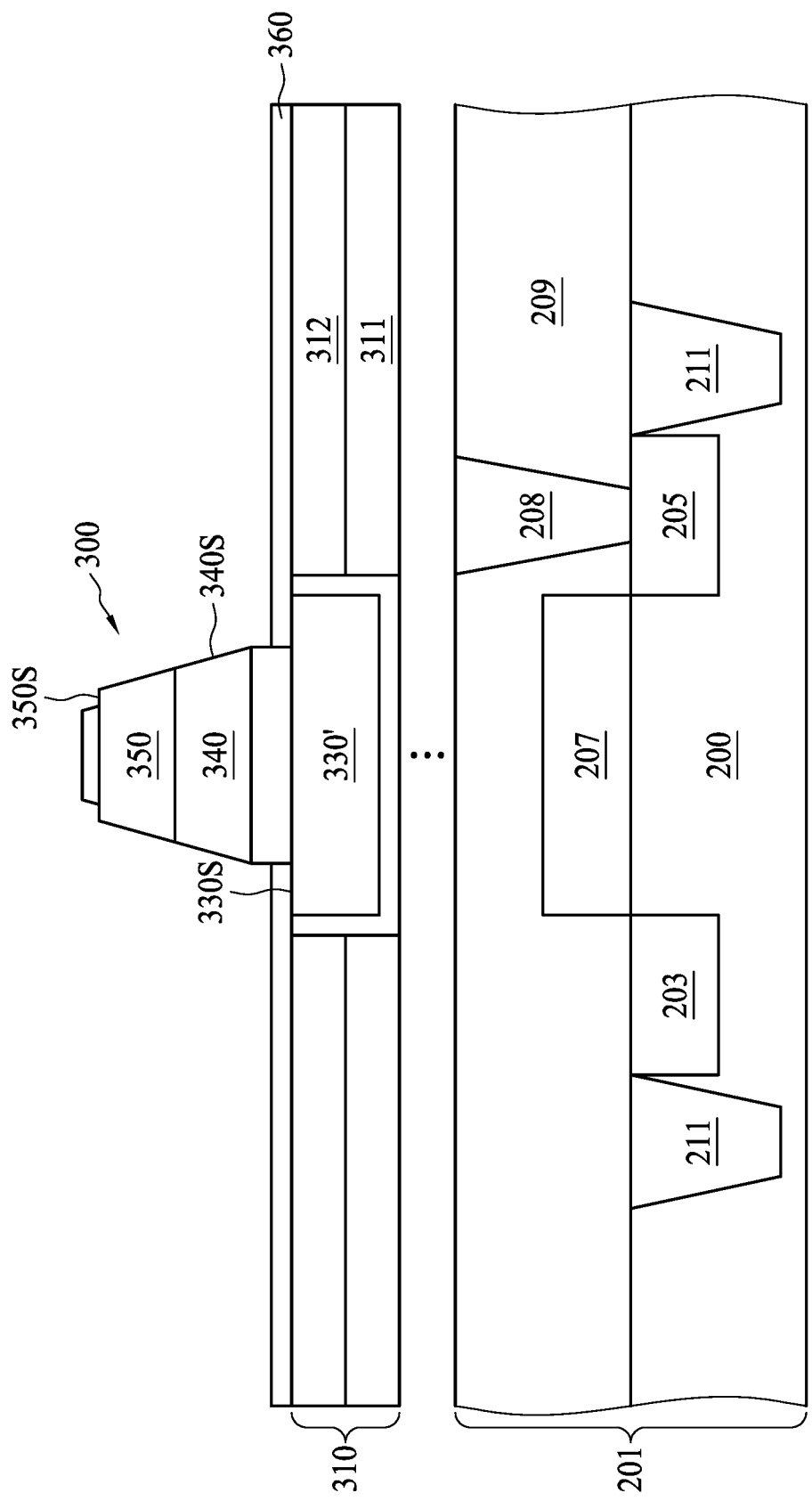

Referring to FIG. 8, FIG. 9, and operation 107 in FIG. 1, a portion of the first dielectric layer 360 is removed. In some embodiments, the first dielectric layer 360 is removed by performing a dry etch applied from a tilted angle θ. In some embodiments, the dry etch in the present operation includes physical etching techniques such as ion beam etch (IBE). In some embodiments, the present dry etch operation can be any suitable dielectric dry etch. In some embodiments, an incident angle θ between the ion beam direction and a sidewall of the MTJ is between 20° and 80°. This is merely examples and is not intended to be limiting.

Referring to FIG. 9, in some embodiments, the sidewall 340S of the MTJ 340 may be exposed or still partially covered by the first dielectric layer 360 after operation 107. In some embodiments, the sidewall 340S of the MTJ 340 is fully exposed. By exposing the sidewall 340S of the MTJ 340, defects or damages on the sidewall 340S of the MTJ 340 may be removed at the same time.

In some embodiments, the first dielectric layer 360 may prevent the bottom electrode via 330' and the first electrode 330 from unnecessary etching. Furthermore, the first dielectric layer 360 may prevent the re-sputtering from the top surface 330S of the bottom electrode via 330' or the first electrode 330 to the sidewall 340S of the MTJ 340. Consequently, MTJ short caused by the aforesaid re-sputtering may be avoided. On the other hand, without depositing the first dielectric layer 360, an appropriate tilted angle θ shall be carefully chosen to mitigate the re-sputtering effect. For example, a smaller tilted angle θ possesses a greater vertical component with respect to ion beam bombardment, whereas a greater tilted angle θ possesses a smaller vertical component. Therefore, smaller tilted angle θ is prone to generate severe bottom electrode re-sputtering. However, greater tilted angle θ accompanies shadowing effect in an etching operation. With the deposition of the first dielectric layer 360 in the present disclosure, the tilted angle θ of the dry etch operation may be chosen in a wider operation window.

In some embodiments, a portion of the first dielectric layer 360 over a top surface 330S of the bottom electrode via 330' and over a top surface 350S of the second electrode 350 may not be removed after operation 107. In some embodiments, the portion of the first dielectric layer 360 over the top surface 350S of the second electrode 350 comprises a remaining thickness of from about 1 nm to about 5 nm. In some embodiments, the portion of the first dielectric layer 360 over the top surface 330S of the bottom electrode via 330' comprises a remaining thickness of from about 1 nm to about 8 nm. In some embodiments, the portion of the first dielectric layer 360 over the top surface 350S of the second electrode 350 is thinner than the portion of the first dielectric layer 360 over the top surface 330S of the bottom electrode via 330'. Alternatively, the portion of the first dielectric layer 360 over the top surface 350S of the second electrode 350 may be removed.

In some embodiments, the differences between the as-deposited thicknesses d1 and d2 (as shown in FIG. 7) of the first dielectric layer 360 are designed based on the ion beam etching rates with respect to the first dielectric layer 360 at the sidewall 340S and the top surface 350S of the second electrode 350. It is desirable that the first dielectric layer 360 at top surface 350S retains a certain thickness while the first dielectric layer 360 at the sidewall 340S of the MTJ 340 is completely etched. In some embodiments, the thickness of the first dielectric layer 360 at the top surface of the bottom electrode via 330' and the barrier layer 310 is similar to that at the top surface 350S (collectively "horizontal portion"). The thickness at the horizontal portion of the first dielectric layer 360 shall be thick enough to prevent bottom electrode from exposure during etching operation and causing re-sputtering of the conductive materials to the sidewall 340S of the MTJ 340.

Figure 10:
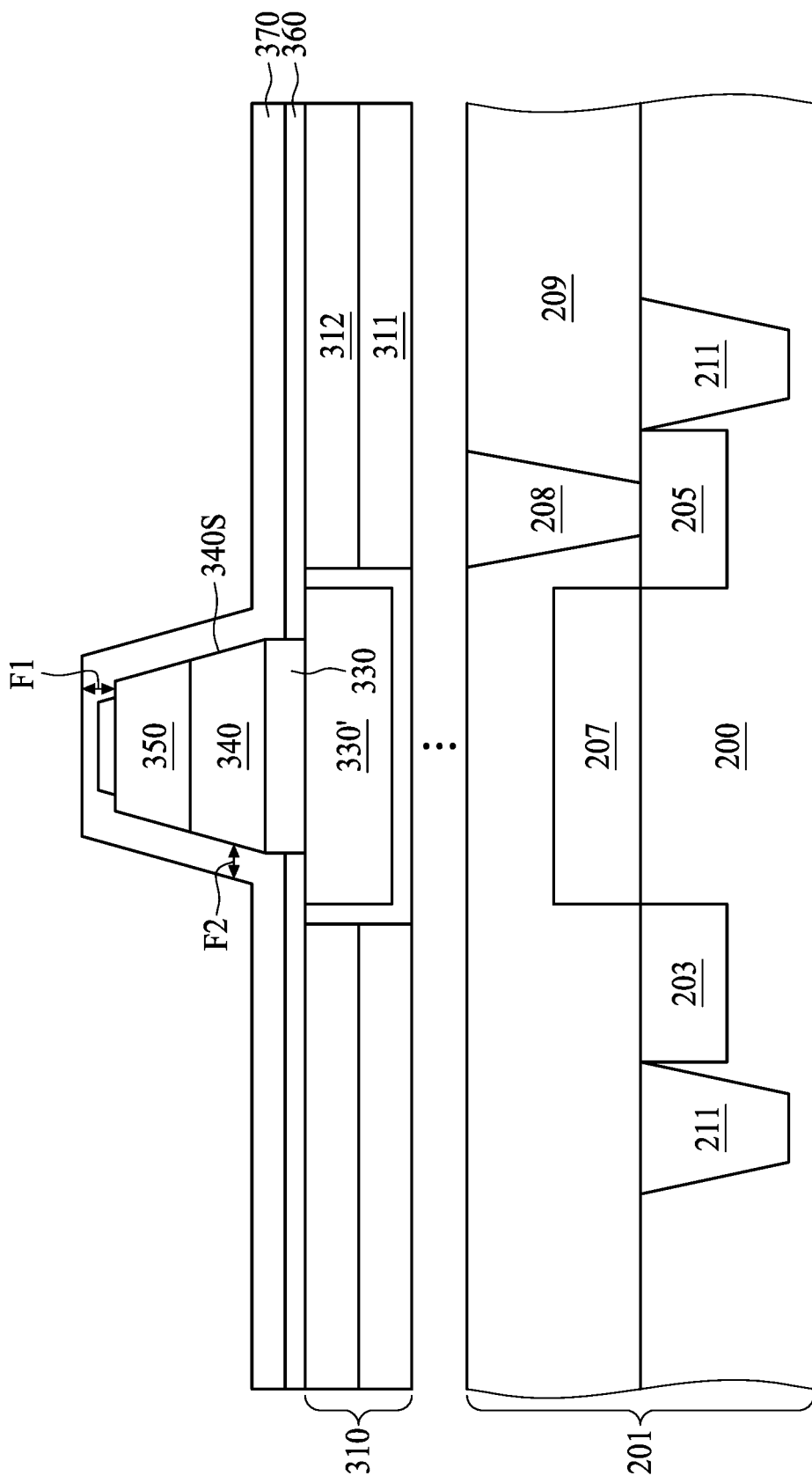

Referring to FIG. 10 and operation 108 in FIG. 1, the second dielectric layer 370 is formed over the first electrode 330, the MTJ 340, the second electrode 350, the barrier layer 310, and an unremoved portion of the first dielectric layer 360. In some embodiments, the second dielectric layer 370 is a protection layer such as a nitride layer. In some embodiments, the second dielectric layer 370 includes materials of silicon oxide (SiO$_x$), silicon nitride (SiN$_x$), silicon oxynitride (SiON), or silicon carbide (SiC), which may be formed by plasma deposition operation, such as Atomic layer deposition (ALD), physical vapor deposition (PVD), or chemical vapor deposition (CVD) including plasma enhanced chemical vapor deposition (PECVD). In some embodiments, the second dielectric layer 370 and the first dielectric layer 360 may include same or different materials.

In some embodiments, the as-deposited second dielectric layer 370 has an overall thickness of from about 1 nm to about 50 nm. In some embodiments, the thickness F2 of the as-deposited second dielectric layer 370 on the sidewall of the MTJ 340 is thinner than the as-deposited thickness F1 on the top surface of the second electrode 350. In some embodiments, the as-deposited thickness F1 may be from about 10 nm to about 50 nm. In some embodiments, the ratio (F1/F2) may be in a range from about 1.2 to about 3.5. This is merely examples and is not intended to be limiting. In some embodiments, the sidewall 340S of the MTJ 340 is in direct contact with the second dielectric layer 370 because the portion of the first dielectric layer 360 at the sidewall 340S has been substantially removed during the dry etch operation previously discussed in FIG. 8. Depositing the second dielectric layer 370 over the sidewall 340S also prevents oxidation or other contamination at the sidewall 340S. In some embodiments, the sidewall of the second electrode 350 is also in direct contact with the second dielectric layer 370.

Figure 11:
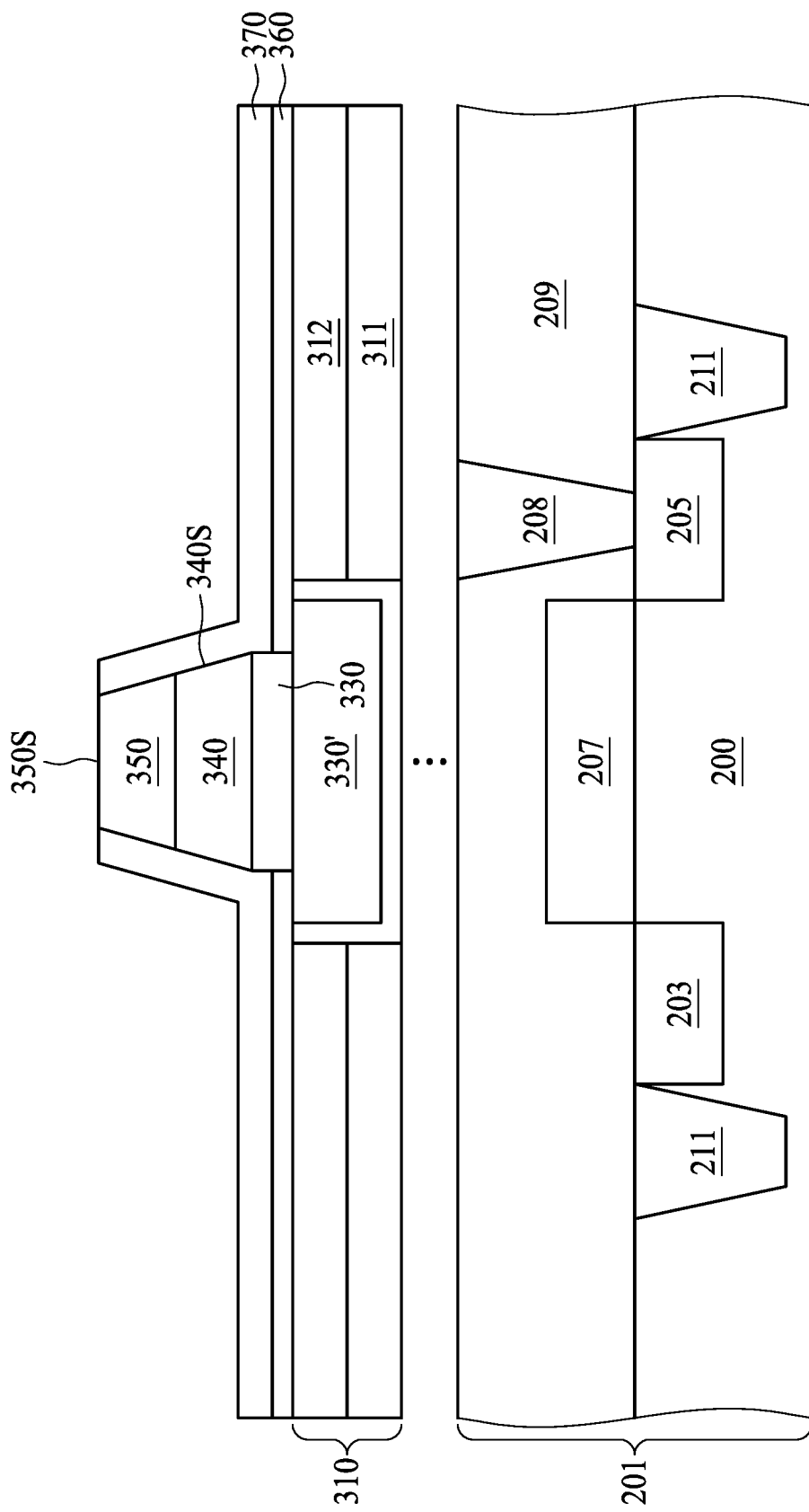

Referring to FIG. 11, in some embodiment, the top surface 350S of the second electrode 350 is exposed from the first dielectric layer 360 and the second dielectric layer 370. In some embodiment, an etch-back operation is performed on the first dielectric layer 360 and the second dielectric layer 370 such that the top surface 350S of the second electrode 350 is exposed from the first dielectric layer 360 and the second dielectric layer 370.

Figure 12:
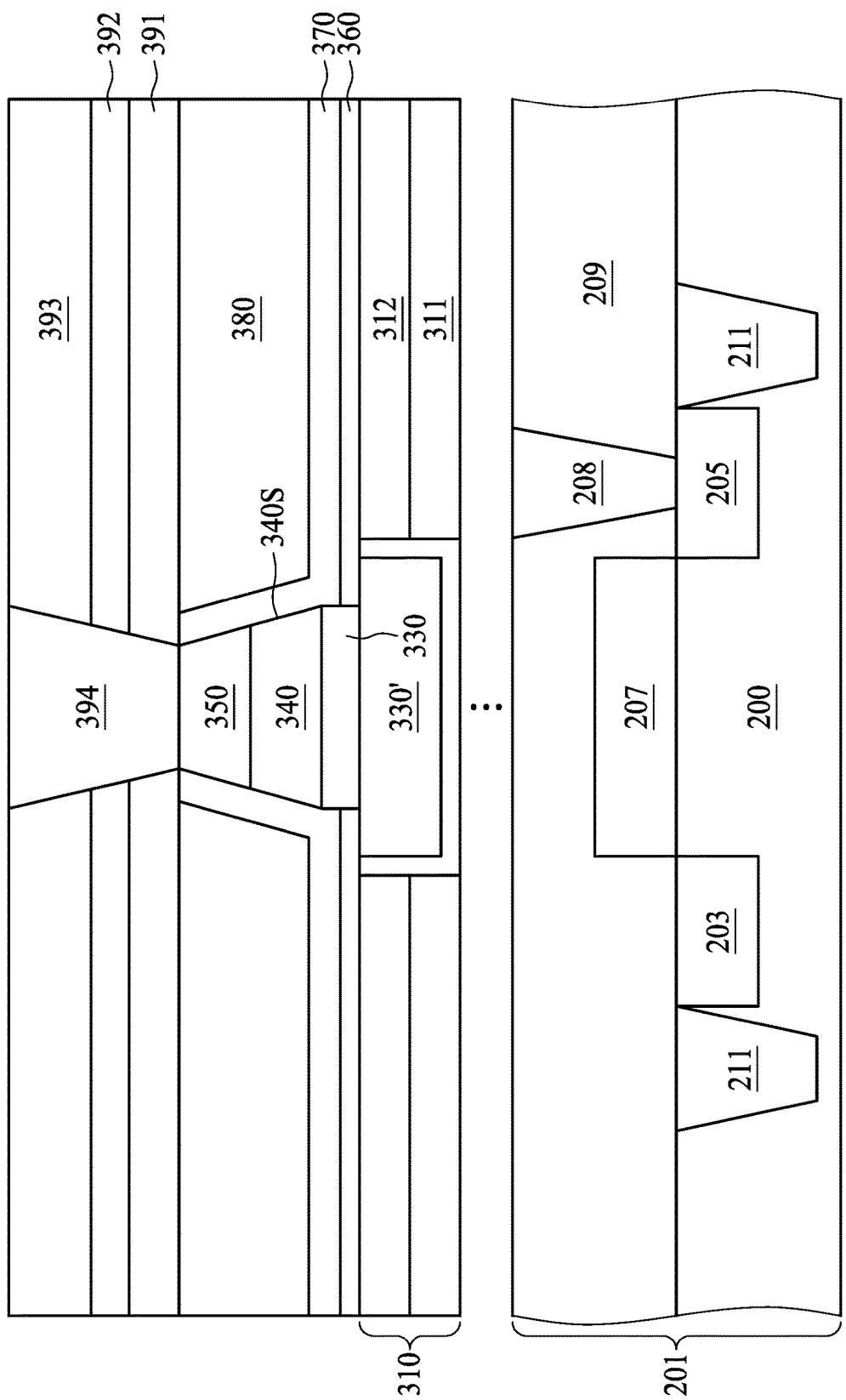

Referring to FIG. 12, in some embodiment, a third dielectric layer 380 is formed over the second dielectric layer 370, and a planarization operation is taken place after the formation of the third dielectric layer 380. In some embodiments, the third dielectric layer 380 such as a TEOS layer is deposited over the second dielectric layer 370. In some embodiments, a thickness of the third dielectric layer 380 is to be determined according to a level of a top surface thereof relative to the top surface of the second electrode 350.

In some embodiments, subsequent operation may further include forming various layers, such as subsequent barrier layers 391, 392 are formed. In some embodiment, a low k dielectric layer 393 is formed over the barrier layer 391, 392, and a via hole is formed to penetrate the low k dielectric layer 393 and the barrier layer 391, 392 underneath, exposing the top surface of the second electrode 350. In some embodiments, the via hole is filled with conductive materials as previously described to form metal via 394 as a part of metallization or interconnect structure.

Subsequent operations may further include forming various contacts/vias/lines and multi-layer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene operation is used to form a copper related multilayer interconnection structure.

In some embodiments, the first dielectric layer may prevent the bottom electrode via and the first electrode from unnecessary etching and re-sputtering. Further, the first dielectric layer may prevent the re-sputtering from the top surface of the bottom electrode via or the first electrode to the sidewall of the MTJ. Consequently, the MTJ short issue caused by the re-sputtering from the first electrode or the bottom electrode via may be avoided. Moreover, conventionally, the larger incident angle θ may be chose because of the smaller angle may cause more re-sputtering from the top surface of the bottom electrode via or the first electrode. In some embodiments, with the first dielectric layer preventing the re-sputtering from the bottom electrode via or the first electrode, the incident angle θ of the dry etch may be chose more flexibly.

Referring to FIG. 12, the semiconductor structure 1 includes a via 330', a first electrode 330 on the via 330', a magnetic tunneling junction (MTJ) 340 over the first electrode 330, a second electrode 350 over the MTJ 340, a first dielectric layer 360 on a top surface of the via 330', a second dielectric layer 370 over the first electrode 330, the MTJ 340, the second electrode 350, and the first dielectric layer 360. A sidewall of the MTJ 340 is in contact with the second dielectric layer 370. The semiconductor structure 1 serves only as one example.

Some embodiments of the present disclosure provide a method for manufacturing a semiconductor structure. The method includes (1) providing a substrate, (2) depositing a first electrode layer over the substrate, (3) depositing a magnetic tunneling junction (MTJ) layer on the first electrode, (4) depositing a second electrode layer on the MTJ layer, (5) patterning the first electrode layer, the MTJ layer, and the second electrode layer to form a first electrode, an MTJ, and a second electrode, (6) forming a first dielectric layer over the first electrode, the MTJ, and the second electrode, (7) removing a portion of the first dielectric layer, (8) forming a second dielectric layer over the first electrode, the MTJ, the second electrode, and an unremoved portion of the first dielectric layer.

Some embodiments of the present disclosure provide a semiconductor structure, including a first electrode via, a first electrode on the first electrode via, a magnetic tunneling junction (MTJ) over the first electrode, a second electrode over the MTJ, a first dielectric layer on a top surface of the first electrode via, a second dielectric layer over the first electrode, the MTJ, the second electrode, and the first dielectric layer. A sidewall of the MTJ is in contact with the second dielectric layer.

Some embodiments of the present disclosure provide a method for manufacturing a semiconductor structure. The method includes (1) forming a magnetic tunneling junction (MTJ) structure over a substrate, (2) forming a first dielectric layer over the MTJ structure, (3) removing a portion of the first dielectric layer thereby exposing a sidewall of the MTJ structure, (4) forming a second dielectric layer over the MTJ structure and the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and operations described in the specification. As one of ordinary skill in the art will readily appreciate from the disclosure of the present processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A semiconductor structure, comprising:
   a first electrode via;
   a first electrode on the first electrode via;
   a magnetic tunneling junction (MTJ) over the first electrode;
   a second electrode over the MTJ;
   a first dielectric layer in contact with a top surface of the first electrode via; and
   a second dielectric layer over the first electrode, the MTJ, and the first dielectric layer, wherein a sidewall of the MTJ is in contact with the second dielectric layer.

2. The semiconductor structure of claim 1, wherein a thickness of the first dielectric layer on the top surface of the first electrode via is in a range of from about 1 nm to about 8 nm.

3. The semiconductor structure of claim 1, wherein the first dielectric layer and the second dielectric layer are composed of different materials.

4. The semiconductor structure of claim 1, further comprising a third dielectric layer over the first dielectric layer and the second dielectric layer.

5. The semiconductor structure of claim 1, wherein the first dielectric layer is thinner than the first electrode.

6. The semiconductor structure of claim 1, wherein the first electrode is laterally surrounded by the first dielectric layer and the second dielectric layer.

7. The semiconductor structure of claim 1, wherein a top surface of the second electrode is exposed from the second dielectric layer.

8. A semiconductor structure, comprising:
   a first electrode via;
   a first electrode on the first electrode via;
   a magnetic tunneling junction (MTJ) over the first electrode;
   a second electrode over the MTJ;
   a first dielectric layer on a top surface of the first electrode via; and
   a second dielectric layer on the first dielectric layer and in contact with a sidewall of the MTJ;
   wherein a sidewall of the first electrode is in contact with the first dielectric layer and the second dielectric layer.

9. The semiconductor structure of claim 8, wherein a thickness of the second dielectric layer is in a range of from about 1 nm to about 50 nm.

10. The semiconductor structure of claim 8, wherein the second dielectric layer is in contact with a sidewall of the second electrode.

11. The semiconductor structure of claim 8, further comprising a third dielectric layer over the first dielectric layer and the second dielectric layer.

12. The semiconductor structure of claim 11, wherein a top surface of the second electrode is exposed from the first dielectric layer, the second dielectric layer, and the third dielectric layer.

13. The semiconductor structure of claim 8, wherein a portion of the sidewall of the first electrode is exposed from the first dielectric layer.

14. The semiconductor structure of claim 8, wherein a thickness of the first dielectric layer is in a range of from about 1 nm to about 8 nm.

15. A semiconductor structure, comprising:
   a transistor structure;
   a first electrode via over the transistor structure;
   a first electrode on the first electrode via;
   a magnetic tunneling junction (MTJ) over the first electrode;
   a second electrode over the MTJ;
   a first dielectric layer on the first electrode via, wherein the first dielectric layer is a planar layer, and a vertical distance between the MTJ and the transistor structure is greater than a vertical distance between the first dielectric layer and the transistor structure; and
   a second dielectric layer on the first dielectric layer, and a sidewall of the MTJ is in contact with the second dielectric layer.

16. The semiconductor structure of claim 15, wherein a portion of a sidewall of the second dielectric layer is conformal with the sidewall of the MTJ.

17. The semiconductor structure of claim 15, wherein a bottom surface of the second dielectric layer is higher than a bottom surface of the first electrode.

18. The semiconductor structure of claim 17, wherein a bottom surface of the first dielectric layer is coplanar with the bottom surface of the first electrode.

19. The semiconductor structure of claim 15, further comprising a third dielectric layer over the second dielectric layer, wherein a top surface of the third dielectric layer is coplanar with a top surface of the second electrode.

20. The semiconductor structure of claim 19, further comprising a barrier layer laterally surround the first electrode via, wherein the barrier layer is covered by the first dielectric layer, the second dielectric layer, and the third dielectric layer.

* * * * *